United States Patent [19]

Giordano et al.

[11] Patent Number: 5,367,211
[45] Date of Patent: Nov. 22, 1994

[54] DIFFERENTIAL AMPLIFIER WITH HYSTERESIS

[75] Inventors: Raymond L. Giordano; Robert H. Isham; Arthur J. Leidich, all of Flemington, N.J.

[73] Assignee: Harris Corporation, Melbourne, Fla.

[21] Appl. No.: 82,546

[22] Filed: Jun. 28, 1993

[51] Int. Cl.$^5$ .................................. H03K 5/22
[52] U.S. Cl. .............................. 327/73; 330/257; 327/52; 327/205
[58] Field of Search ............... 307/494, 354, 355, 496, 307/360, 362, 290; 330/257, 260

[56] References Cited

U.S. PATENT DOCUMENTS

| | | | |
|---|---|---|---|
| 4,110,641 | 8/1978 | Payne | 307/355 |
| 4,338,527 | 7/1982 | Nagano | 307/494 |
| 4,394,587 | 7/1983 | McKenzie et al. | 307/355 |
| 4,438,349 | 3/1984 | Shoji | 307/354 |
| 4,577,121 | 3/1986 | Sano et al. | 307/355 |
| 4,617,481 | 10/1986 | Masuda | 307/491 |
| 4,634,897 | 1/1987 | Yoshioka | 307/355 |
| 4,686,395 | 8/1987 | Sato et al. | 307/362 |
| 4,806,791 | 2/1989 | Mizuide | 307/355 |
| 4,835,417 | 5/1989 | Kousaka et al. | 307/362 |
| 5,038,055 | 8/1991 | Kinoshita | 307/494 |
| 5,043,599 | 8/1991 | Zitta | 307/355 |
| 5,191,235 | 3/1993 | Hara | 307/355 |
| 5,223,927 | 6/1993 | Kageyama et al. | 307/494 |

*Primary Examiner*—Timothy P. Callahan
*Assistant Examiner*—T. T. Lam
*Attorney, Agent, or Firm*—Henry I. Schanzer; C. C. Krawczyk; W. A. Troner

[57] ABSTRACT

A current source is selectively switched into the output circuit of a differential amplifier for producing hysteresis. In a circuit embodying the invention, a differential amplifier (diff-amp) stage operated at a first current level set by a first current source has first and second input terminals for the application therebetween of a differential input signal and first and second output nodes for the production of differential output signals. A second current source for inducing hysteresis is connected to one of the output nodes of the diff-amp and is selectively enabled. A differential input signal (VIN) is applied across the input terminals. When VIN varies in one direction and reaches a first threshold level, the second, hysteresis inducing, current source is enabled whereby a larger current can flow in the one node. VIN then has to vary in the opposite direction and reach a second threshold level to disable the second current source. When the first threshold level is reached the output of the amplifier stage switches from a first state to a second state and when the second threshold level is reached the output of the amplifier switches from the second state to the first state.

18 Claims, 3 Drawing Sheets

DIFFERENTIAL AMPLIFIER WITH HYSTERESIS

BACKGROUND OF THE INVENTION

This invention relates to circuits exhibiting hysteresis and, in particular, to a circuit capable of producing a well defined and controlled amount of hysteresis.

In circuits exhibiting hysteresis the value of the input signal for which the output signal switches from one state to another depends on whether the input signal is increasing or decreasing. Thus, for example, when the input signal is increasing and reaches a first threshold level, the output switches from a first state (e.g., high) to a second state (e.g., low) and remains in the second state for all values of the input signal in excess of the first threshold level. When the input signal is decreasing, it must reach a second threshold level, different from the first level, to cause the output to switch from the second state to the first state. Such circuits thus exhibit two different threshold levels; one threshold when the input voltage is increasing and the other threshold when the input voltage is decreasing.

Circuits exhibiting hysteresis have increased noise immunity and are therefore extremely useful for reliable operation in an electronically noisy environment. Such circuits are also useful for converting slowly varying signals into pulses having well defined and sharp leading and trailing edges. There is therefore a need in many applications for circuits exhibiting hysteresis and for circuits where the amount of the hysteresis is stable and well defined.

SUMMARY OF THE INVENTION

Circuits embodying the invention include means for switching a current source into the output circuit of a differential amplifier for producing hysteresis.

A circuit embodying the invention includes a differential amplifier (diff-amp) stage operated at a first current level set by a first current source and having first and second input terminals for the application therebetween of a differential input signal and first and second output nodes for the production of differential output signals. A second current source for inducing hysteresis is connected to one of the output nodes of the diff-amp and is selectively enabled. A differential input signal (VIN) is applied across the input terminals. When VIN varies in one direction and reaches a first threshold level, the second hysteresis inducing current source is enabled whereby a larger current can flow in the one node. VIN then has to vary in the opposite direction and reach a second threshold level to disable the second current source. When the first threshold level is reached the output of the amplifier stage switches from a first state to a second state and when the second threshold level is reached the output of the amplifier switches from the second state to the first state.

In one embodiment of the invention, the diff-amp includes first and second transistors, with each transistor having first and second electrodes defining the ends of a main conduction path and a control electrode, and each transistor being turned-on when the potential between its control and first electrodes exceeds a minimum value in a direction to turn-on the transistor. The first and second transistors are differentially connected in that their first electrodes are connected in common to a first node to which is applied a first relatively constant current of amplitude IA. An input signal is applied between the control electrodes of the first and second transistors. The circuit also includes first and second current mirror amplifiers (CMAs), each CMA having an input terminal and an output terminal and each CMA producing an output current at its output terminal which is proportional to the input current at its input terminal. The input terminal of the first CMA and the output terminal of the second CMA are connected to the second electrode of the first transistor and the output terminal of the first CMA is connected to the second electrode of the second transistor. The circuit also includes a second current source for producing a current IB and means coupled to the second electrode of the second transistor for sensing the current flowing between the output of the first CMA and the second electrode of the second transistor and for, in response thereto, selectively enabling the current IB to flow in the input terminal of the second CMA and a corresponding current to flow in its output terminal.

In a particular embodiment, when the current in the output terminal of the first CMA is less than the current passed by the second transistor, the current IB is enabled to flow in the input of the second CMA whereby a current proportional to IB can flow between the output of the second CMA and the second electrode of the first transistor, and when the current in the output terminal of the first CMA is equal to or greater than the current passed by the second transistor, the current IB is prevented from flowing in the input of the second CMA.

According to another aspect of the invention, the second current source produces a current IB which is proportional to the current IA produced by the first current source, whereby IB is equal to KIA, where K is a constant which may range in value from less than one to more than one.

BRIEF DESCRIPTION OF THE DRAWING

In the accompanying figures like reference characters denote like components.

DETAILED DESCRIPTION OF THE INVENTION

Figure 1:
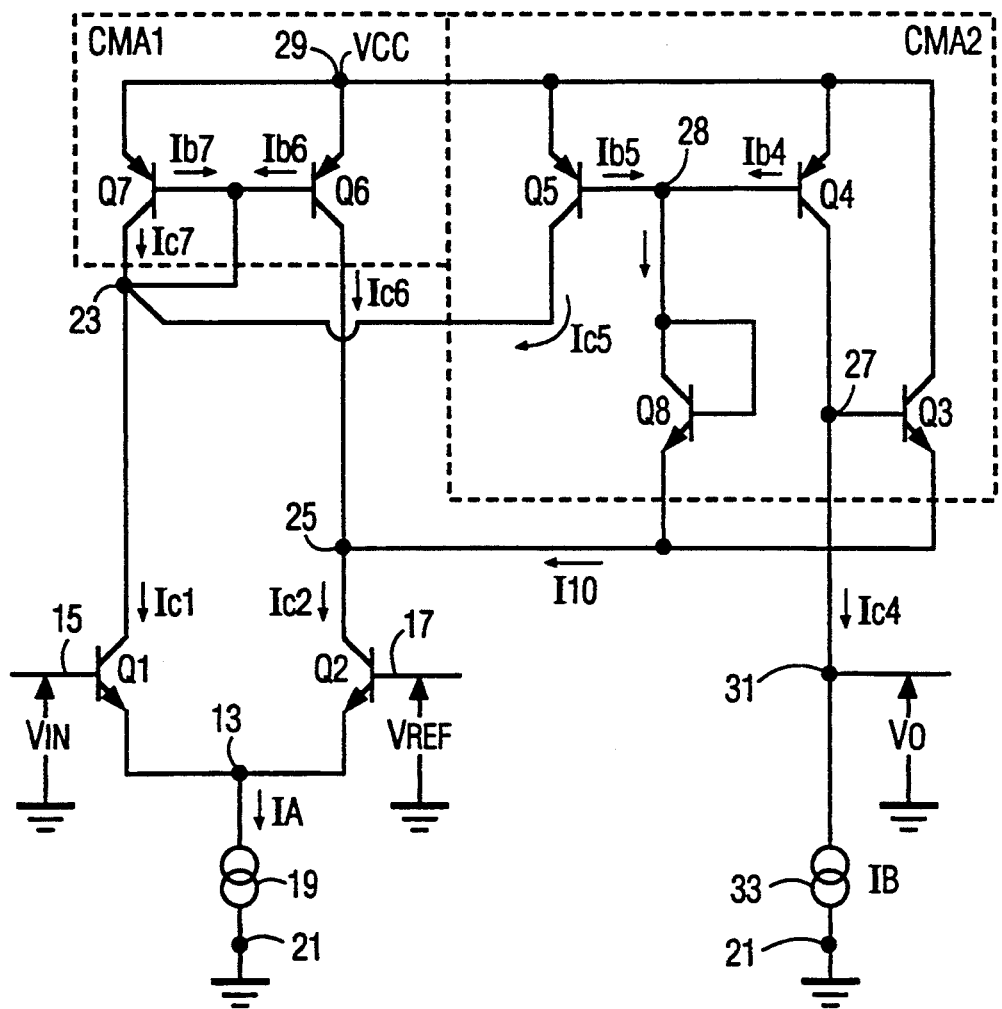
FIG. 1 is a schematic diagram of a circuit embodying the invention.

The circuit of FIG. 1 includes first and second differentially connected bipolar transistors Q1 and Q2 whose emitters are directly connected to a common terminal 13. The base of Q1 is connected to an input terminal 15 to which is applied an input voltage, VIN, and the base of Q2 is connected to an input terminal 17 to which is applied a reference voltage, VREF. A relatively constant current source 19, generating a current IA, is connected between node 13 and terminal 21 to which is applied ground potential.

The collector of Q1 is connected to a differential output terminal 23 to which is connected the base and collector of a PNP bipolar transistor Q7, the base of a PNP bipolar transistor Q6, and the collector of a PNP bipolar transistor Q5. The collector of transistor Q2 is connected to a differential output terminal 25 to which is connected the collector of Q6 and the emitters of NPN bipolar transistors Q3 and Q8. The collector and base of Q8 are connected to node 28 whereby Q8 is connected and functions like a diode. The bases of PNP bipolar transistors Q4 and Q5 are connected to node 28. The base of Q3 is connected to a terminal 27 to which is connected the collector of Q4. The emitters of transistors Q4, Q5, Q6 and Q7 and the collector of Q3 are connected to a power terminal 29 to which is applied an operating potential of VCC volts, where VCC may be typically in the range of 5 to 15 volts.

The base of Q3 and the collector of Q4 are connected to amplifier output terminal 31, at which is produced the output voltage, Vo, of the amplifier stage. A current source 33 is connected between terminal 31 and ground terminal 21 and produces a current IB.

Figure 2:
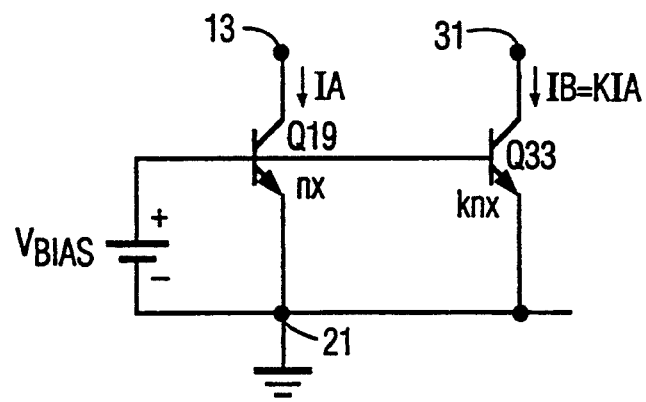
FIG. 2 is a schematic diagram of circuitry for producing current sources which may be used in the circuit of FIG. 1.

The currents IA and IB may be produced as shown in FIG. 2. That is, a bias voltage ($V_{BIAS}$) is applied to the base of an NPN bipolar transistor Q19 whose collector is connected to node 13 and whose emitter is returned to ground. Q19 then functions as a relatively constant current source producing a current IA. The equivalent circuit of Q19 may be a current source as shown in FIG. 1. Similarly, $V_{BIAS}$ is applied to the base of an NPN bipolar transistor Q33 whose collector is connected to node 31 and whose emitter is returned to ground. Q33 then functions as a relatively constant current source producing a current IB which is equal to KIA; where K is normally less than 1; (K may be made greater than one if transistor ratioing is used to add multiplication to the K ratio equations). The ratio of the current IA through Q19 to the current KIA through Q33 is a function of the relative sizes of transistors Q19 and Q33. That is, K of KIA is equal to the ratio of the size of Q33 to that of Q19. Thus when Q33 is made larger than Q19, K is proportionately greater than one, and when Q33 is made smaller than Q19, K is proportionately smaller than one. The equivalent circuit of Q33 may be a current source 33 as shown in FIG. 1.

[Note: In the discussion to follow, the collector current (IC) of a transistor Qx is denoted as ICx and its base current is denoted as Ibx.]

Referring to FIG. 1, note that transistors Q6 and Q7 are interconnected to form a first current mirror amplifier (CMA1) with Q6 mirroring the current flowing in Q7. CMA1 comprised of Q7 and Q6 may be considered to have an input terminal (collector and base of Q7 and the base of Q6) and an output terminal (the collector of Q6). The current (IC6) flowing in the output terminal of CMA1 is proportional to the current (IC7) flowing in the input terminal as a ratio of the size of Q6 to that of Q7. When Q6 and Q7 are made the same size, the output current (IC6) is approximately equal to the input current (IC7); the base currents, Ib6 and Ib7 are small and are ignored for the reasons discussed below.

Transistors Q6 and Q7, as well as the other bipolar transistors of the circuit, are designed to have very large forward current gains (Betas); typically, the Betas of these transistors are designed to be 100 or more. Therefore, the base currents of the transistors are very small compared to their collector currents and, except where significant, will be ignored. Thus, to a first approximation, it may be assumed for CMA1 that when Q6 is the same size as Q7, the output current, IC6, of CMA1 is equal to the input current, IC7, of CMA1.

Transistors Q4 and Q5 are also interconnected to function as a current mirror amplifier (CMA2) with Q5 mirroring the current in Q4. That is, the collector current (IC5) of Q5 defines the output current of CMA2 which is proportional to the collector current (IC4) of Q4 which defines the input current of CMA2; (Note that Ib4 and Ib5 which flow in the collector-to-emitter path of Q8 are being ignored for the reason noted above). Where Q5 is the same size as Q4, IC5 may be assumed to be equal to IC4. Furthermore, where IB is equal to KIA, IC4 is equal to KIA (when Q3 and Q8 are fully-on) and IC5 is then also equal to KIA. For ease of illustration, it is assumed in the discussion to follow that Q6 and Q7 are made the same size and that Q4 and Q5 are made the same size.

(a) The operation of the circuit of FIG. 1 will now be described by first analyzing the condition when VIN is less than VREF.

When VIN is less than VREF, Q1 is turned off and Q2 is turned on. When Q1 is turned off, no current is drawn through Q7 and/or out of the base of Q6. Hence, Q6 and Q7 are non-conductive. Since Q6 is non-conductive and since Q2 is on and conducting, Q2 draws its collector current, IC2, from the emitters of Q3 and Q8 which, in turn, cause a collector-to-emitter current to flow through Q4. The turn-on mechanism for Q3, Q4 and Q8 may be explained as follows. As soon as Q2 conducts a current IC2 which is slightly greater than IC6, base currents Ib4 and Ib5 flow from the bases of Q4 and Q5 and via the collector to emitter path of Q8 into the collector of Q2. When this happens, Q4 conducts and supplies a current into the base of Q3. For this condition, Q3 then functions as a common collector transistor supplying a large multiplied current and, together with Q8, supplies a current I10 into node 25. Hence for the condition of Q3 and Q8 conducting, the voltage at output terminal 31 is equal to Vcc minus the sum of the base to emitter drops of Q4 and Q8 plus the base to emitter voltage drop of Q3.

When Q3 is turned-on, it causes the voltage (Vo) at the output node 31 to be "high"; i.e., Vo is equal to VCC less a base to emitter (VBE) diode drop. Concurrently, the turn-on of Q3 and Q8 causes the current IB from current source 33 to flow in the input of CMA2 (collector of Q4) and to be mirrored in the output of CMA2 (collector of Q5). Thus, with Q3 and Q8 turned on, the current source 33 in the collector circuit of Q4 supplies a current IB which is coupled to the input of CMA2. Where IB is equal to KIA, KIA is being supplied to the input of CMA2 and Q5 is biased to supply a current KIA at the output of CMA2 into the collector of Q1, even though Q1 is not conducting. Thus, for VIN less than VREF, Q2 is turned on and draws current out of node 25 tending to pull current out of the emitters of Q3 and Q8, turning them on and producing a "high" at output node 31. Concurrently, for Q3 and Q8 switched-on and for Q4 and Q5 conducting, Q5 is biased to supply a current IB (which may be assumed to be equal to KIA) into node 23 and into the collector of Q1. Thus, current source Q5 is connected in parallel with Q7 and continues to supply current into node 23 until Q3 and Q8 are turned off.

b) A further analysis of the circuit of FIG. 1 reveals that Q3 will be turned off when the current IC6 through Q6 is equal to or greater than the current IC2 drawn or passed by Q2. So long as Q3 and Q8 are turned-on and Q4 and Q5 are conducting, VIN must increase above VREF by some voltage which will be defined as the "hysteresis voltage" or VH to cause the current IC6 through Q6 to equal the current IC2 through Q2 and to cause Q3 and Q8 to turn-off and the voltage at output node 31 to switch from high to low. This is best demonstrated by examining the circuit response to an increase in VIN from a value less than VREF to a value where VIN is equal to VREF. For VIN=VREF, the current IC1 in Q1 is equal to the current IC2 in Q2 (i.e., IC1=IC2). However, note that IC1 is equal to IC5 plus IC7. For ease of illustration, it is assumed in the discussion to follow that IB is equal to KIA. Since Q4 and Q5 are full-on IC5 may be assumed to be equal to KIA. Where, for example, K is equal to ½, KIA is equal to IA/2, and, for VIN=VREF, IC1 is equal to IA/2. However all the current (i.e., IA/2) flowing into the collector of Q1 comes from Q5. Q1 draws no current from Q7 and hence IC7 is equal to zero. When IC7 is equal to zero, IC6 which mirrors the value of IC7 is also zero. Hence, even though Q1 is on and conducting, Q7 is still not conducting and Q6 is also not conducting. Thus, Q2 continues to draw current out of the emitters of Q3 and Q8 causing KIA to flow through Q4 and be mirrored via Q5 into the collector of Q1. Therefore, it is evident that VIN must increase above VREF and cause additional conduction in Q1 to turn-off Q3 and Q8.

To turn-off Q3 and Q8, VIN must increase by some voltage VH above VREF. For such a value of VIN, the current IC1 in Q1 is greater than IC5 and causes a current IC7 to flow in Q1 and Q7 causing an IC6 to flow into the collector of Q2 such that IC6 is equal to IC2. When that occurs, the emitter currents of Q3 and Q8 go to zero and Q3 and Q8 are turned off. By way of example, assuming K is equal to ½ and IB is equal to KIA, the switching or threshold condition may be determined to a rough approximation as follows. For IA supplied to node 13 by current source 19, IC1 plus IC2 is always equal to IA. For KIA equal to IA/2, IC5 is assumed equal to IA/2 when Q3 and Q8 are on. Therefore, the switching point condition which is defined as IC6 being equal to IC2 occurs when IC1 (which is equal to IC5 plus IC7) is equal to 3IA/4 and IC2 is equal to IA/4. Since IC5 is equal to IA/2, it is evident that IC7 is then equal to IA/4. When IC7 is equal to IA/4, IC6 is also equal to IA/4. Since IC2 and IC6 are equal to IA/4 all the current drawn by Q2 is supplied by Q6 and the emitter currents of Q3 and Q8 are equal to zero and Q3 and Q8 are turned off. Thus, to turn-off Q3 and Q8, VIN must increase by a voltage VH above VREF to cause IC1 to be sufficiently greater than IC5 to permit a sufficiently high IC7 to flow in order to create a condition where IC6 is equal to IC2.

When Q3 and Q8 are turned off, the output voltage Vo switches from the high level and goes to, or close to, zero. Concurrently, Q4 is turned off and no further current flows through Q5 and via Q5 into the collector of Q1. Once Q4 is turned off, CMA2 is effectively removed from the circuit. Q1 and Q2 then operate as a balanced differential amplifier stage.

Figure 3:
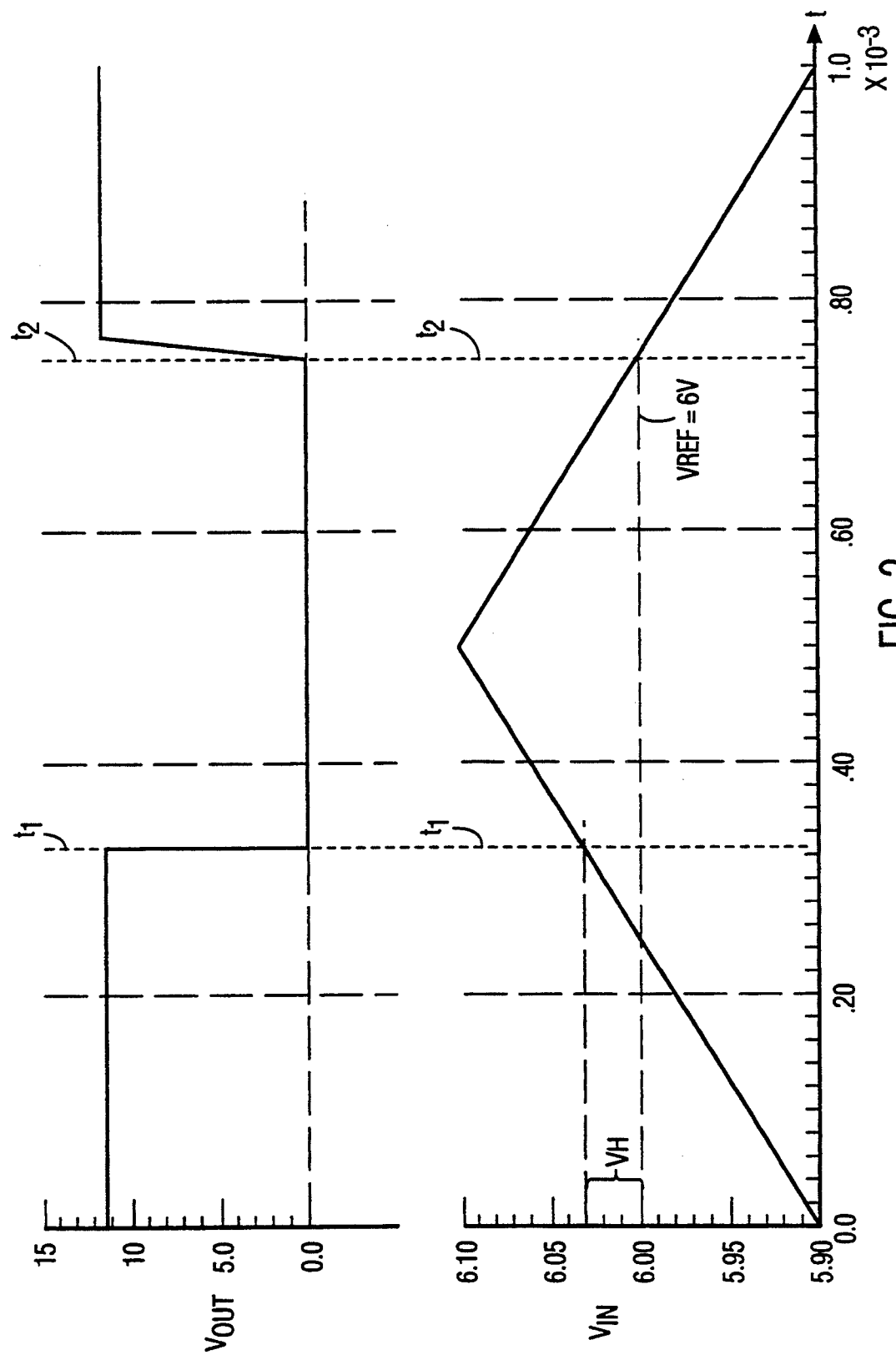
FIG. 3 is a diagram of an input signal applied to the circuit of FIG. 1 and the output signal produced in response thereto.

The operation of the circuit of FIG. 1 may also be described with reference to FIG. 3. Assume, for example, that VREF is equal to 6 volts and VCC is equal to 12 volts. For the condition of K=½, VIN has to increase from less than 6 volts to, for example, 6.03 volts to cause Vo to switch from the "high" to the "low" level condition, as shown in FIG. 3 for time t1. Once VIN exceeds 6.03 volts (i.e., the hysteresis voltage, VH, is equal to 0.03 volts) the differential amplifier is balanced and Vo remains low until VIN decreases and becomes equal to VREF. That is, once VIN rises to a value equal to or greater than 6.03 volts, Q4 and Q5 are turned off (CMA2 is non-conducting) and only Q6 and Q7 are biased to supply currents (CMA1 is conducting) to Q1 and Q2. For all values of VIN greater than VREF IC1 is greater than IC2. Therefore, IC7 which is equal to IC1 and IC6 which is equal to IC7 will be greater than IC2. Hence, the emitter currents of Q3 and Q8 remains zero and Q3 and Q8 remain turned off. This signal condition is maintained until VIN decreases and becomes equal to VREF, as shown for time t2 in FIG. 3.

However, as soon as VIN decreases slightly below VREF and the current IC2 through Q2 becomes a little greater than IC1, Q2 begins to conduct current out of the emitters of Q3 and Q8, causing current to flow through Q4, which current is mirrored via Q5 into the collector of Q1, causing a decrease in IC7 and hence in IC6 and an increase in the emitter currents of Q3 and Q8. Hence, for a very small change in VIN below VREF, Q3 and Q8 are turned-on hard and Q4 passes the current KIA which is mirrored via Q7 while concurrently driving the output Vo to, or close to, VCC volts.

There are two threshold conditions; one threshold condition corresponding to Q3 and Q8 being turned-on and the other corresponding to Q3 and Q8 being turned-off. The threshold conditions may be characterized as follows:

1— Q3 and Q8 are cut off and non-conducting when Q2 is non conducting or when the current IC6 is equal to, or greater than, the current IC2. Current source 33 then sinks current from output node 31 and clamps node 31 to, or close to, ground.

2— Q3 and Q8 are turned-on when Q2 can conduct more current than can be supplied by IC6. Q3 and Q8 then enable the current IB from current source 33 to flow in the input (collector of Q4) of CMA2 which in turn causes a current proportional to the current source 33 current to be supplied to the collector of Q1. Also, when Q3 and Q8 are turned on, they cause the output voltage, Vo, at node 31 to go high since they couple VCC less a diode drop to node 31. The current fed into the collector of Q1 determines (to a great extent) the amount by which VIN must exceed VREF to cause the amplifier output to switch state.

The switching or threshold levels of the circuit of FIG. 1 (and similarly for that of FIG. 4, below) may be derived and expressed mathematically as follows based on the assumption that the current IB is equal to KIA, where IA is the current into node 13 of the diff-amp and ignoring base currents.

One threshold condition occurs when Q4 and Q5 are on and VIN is increased to the point that IC6 is just about to equal IC2. At that point the circuit conditions may be described as follows:

| | |
|---|---|
| $IC1 + IC2 = IA$ | EQ. 1 |
| $IC1 = IC7 + IC5$ | EQ. 2 |
| $IC2 = IC6 + I10$ | EQ. 3 |
| $IC5 = KIA$ | EQ. 4 |
| $IC6 = IC7$ | EQ. 5 |

Where I10 is equal to the sum of the emitter currents of Q3 and Q8. However, note that at the switching point IC2 is equal to IC6 and I10 is equal to zero. Therefore, substituting EQ. 5 into EQ. 3 and assuming I10 to be equal to zero, produces:

$$IC2 = IC7 \qquad \text{EQ. 6}$$

Substituting EQ. 6 and EQ. 4 into EQ. 2 produces:

$$IC1 = IC2 + KIA \qquad \text{EQ. 7}$$

Substituting EQ. 7 into EQ. 1 produces:

$$IC1 + IC1 - KIA = IA$$

Solving for IC1 and IC2, produces:

$$IC1 = (1+K)IA/2 \qquad \text{EQ. 8}$$

$$IC2 = (1-K)IA/2 \qquad \text{EQ. 9}$$

The input voltage (VIN) required to generate the conditions of EQ. 8 and 9 may be set forth as follows:

$$VIN = VREF + VBEQ1 - VBEQ2 \qquad \text{EQ. 10}$$

Introducing the values of IC1 and IC2 into their respective VBE terms produces:

$$VBEQ1 = VBE \text{ as a function of } [(1+K)IA/2];$$

and $$VBEQ2 = VBE \text{ as a function of } [(1-K)IA/2] \qquad \text{EQ. 11}$$

Substituting EQ. 11 into EQ. 10 and recognizing that the VBEQ terms includes natural logarithms, EQ. 10 may be rewritten as follows:

$$VIN = VREF + VBE[(1+K)IA/2] - VBE[(1-K)IA/2] \qquad \text{EQ. 12}$$

which may be rewritten as:

$$VIN = VREF + DELTA\ VBE[(1+K)/(1-K)] \qquad \text{EQ. 13}$$

where DELTA VBE is equal to $[kT/q][\ln IC1/IC2]$; where k is equal to the Boltzman Constant and T is equal to the absolute temperature in degrees Kelvin and q is equal to the unit of electronic charge; with the ratio of k/q assumed to be equal to 86.17 microVolts per degrees Kelvin.

The value of VIN defined by EQ. 13 is the value of VIN for which Q2 reaches the level where it draws substantially the entire current supplied by Q6. When VIN increases above the level identified in EQ. 13, the current produced by Q6 is greater than the current drawn by Q2 and the emitter currents of Q3 and Q8 go to zero.

The second threshold may be determined as set forth below. When VIN decreases to the point where IC6 is just less than IC2, there is some current flow in the emitters of Q3 and Q8 and, due to regenerative feedback the output returns to the state where Vo is high. This condition happens when $$IC1 = IC2 \qquad \text{EQ. 14.}$$

For the condition of EQ. 14, VIN is equal to VREF which defines the second trip or threshold voltage.

The hysteresis voltage is then equal to:

$$VH = \text{delta } VBE[(1+K)/(1-K)] \qquad \text{EQ. 15}$$

At 25 degrees centigrade and for $K=\frac{1}{3}$, VH is approximately equal to 28 millivolts.

Figure 4:
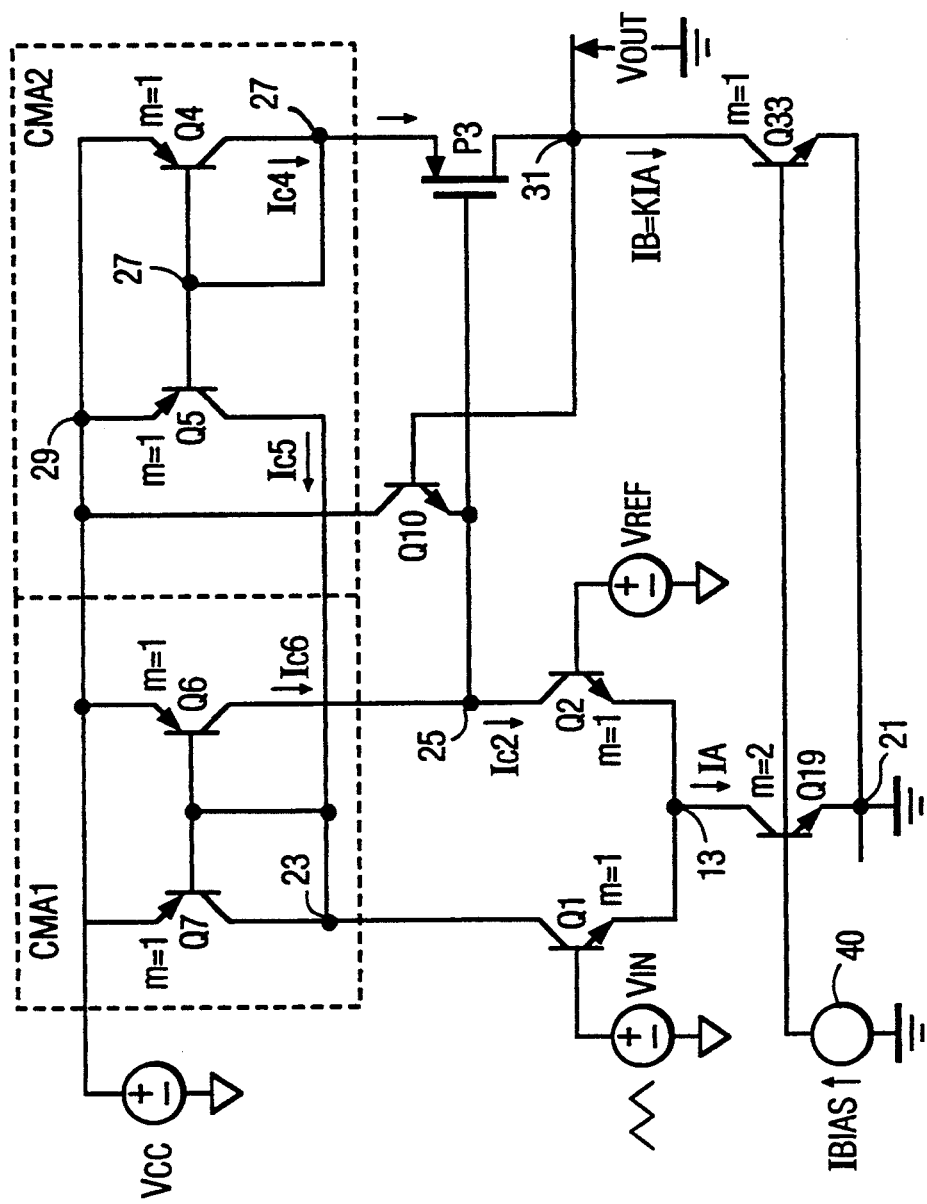
FIG. 4 is a schematic diagram of another circuit embodying the invention.

In the circuits of FIGS. 1 and 4 one threshold level corresponds to VIN equal to VREF and the other threshold level corresponds to VIN being equal to DELTA VBE $[(1+K)/(1-K)]$.

The circuit of FIG. 4 is similar to that of FIG. 1, except that Q3 and Q8 are eliminated and a field effect transistor, P3, is used to sense the current and voltage at node 25. In addition, a transistor Q10 is provided to prevent node 25 from being pulled down when P3 is turned on, as further described below. In FIG. 4, differential output node 25 is coupled to the gate electrode of P-conductivity type insulated-gate field-effect transistor (IGFET) P3. The source electrode of P3 is connected to node 27 to which the bases of Q4 and Q5 and the collector of Q4 are connected and the drain of P3 is connected to node 31. Transistor Q10 is connected at its base to node 31, at its collector to terminal 29 and at its emitter to node 25. In FIG. 4, the drain of P3 is directly connected the collector of Q33. Q33 is biased to function as a relatively constant current source 33, connected between output terminal 31 and ground terminal 21. In FIG. 4 the size of Q19 is shown to be twice (m=2) the size of Q33 (m=1). Consequently, Q33 conducts one-half the current of Q19, and K is equal to $\frac{1}{3}$.

In the circuit of FIG. 4 the current IA and KIA are produced in a similar manner to that shown in FIG. 2. That is, a bias voltage (VBIAS) is applied to the bases of NPN bipolar transistors Q19 and Q33. The collector of Q19 is connected to node 13 and its emitter is connected to ground terminal. Q19 then functions as a relatively constant current source corresponding to source 19 shown in FIG. 1. Similarly, the collector of transistor Q33 is connected to node 31 and its emitter is returned to ground terminal. So biased, Q33 then functions as a relatively constant current source. The relative sizes of transistors Q19 and Q33 determines the ratio of the current IA through Q19 to the current KIA through Q33.

In the circuit of FIG. 4, when IC2 is greater than IC6 the potential at node 25 is driven low and P3 is turned on hard. When IC6 is equal to or greater than IC2, P3 is turned-off. P3 thus functions as a switch. When P3 is turned on it functions as a low impedance connection between node 31 and the input terminal of CMA2, where the input terminal of CMA2 includes the collector and base of Q4 and the base of Q5. Thus when P3 is turned-on it draws current out of the bases of Q4 and Q5. The base current drawn from Q4 turns it on and causes the current KIA to flow through Q4 and to be mirrored through Q5. When P3 is turned-on, it functions as a low impedance connection and ensures that the voltage at output terminal 31 is equal to the voltage VCC at terminal 29 less the VBE of Q4 and the source to drain voltage (VDS) of P3. When P3 is turned-off no current flows through the bases of Q4 and Q5 and Q5 supplies no current into node 23. P3 then functions as a high impedance and the voltage at terminal 31 is driven towards ground potential.

It should be appreciated that transistor P3 functions as a switch for controlling the application of the current IB from Q33 to CMA2. P3, when on, also functions to couple the output node 31 to a high level. Still further, P3 functions as a voltage follower relative to nodes 25 and 27 and as an inverter relative to the differential signal at node 25 and the output signal at node 31. Note that Q10 is provide to clamp the voltage at node 25 when P3 is turned-on and conducting. When Q2 is turned-on and conducting hard and pulls down node 25, P3 turns on and the voltage at the output terminal 31. The rising voltage at terminal 31 is applied to the base of Q10, turning it on and preventing node 25 from being pulled down further. The turn on of Q10 ensures a supply of current to the collector of Q2 such that Q2 does not act like a diode and load down the VREF applied to its base.

In FIG. 4, the gate of switch P3 is shown connected to the collector of Q2 to sense, and respond to, the current flow between Q6 and Q2, and the conduction path of P3 is connected between the collector of Q4 and output terminal 31, for switching current source 33 in and out of the circuit.

The hysteresis can be centered around the reference voltage VREF by altering, for example, the ratios of the differential input transistors Q1 and Q2. Thus, in the circuit of FIG. 1 making the ratio of the size of Q1 to that of Q2 equal to 1.732:1 and for K=½, the trip points or threshold levels are set at VREF+VH/2 AND VREF-VH/2.

In the circuits of FIGS. 1 and 4, K must be less than 1 because all the key transistor ratios are 1:1. However K may be greater than 1, where for example the ratio of Q4 to Q5 is greater than 1.

What is claimed is:

1. The combination comprising:
    a plurality of transistors, each transistor having first and second electrodes defining the ends of a main conduction path and a control electrode, each transistor being turned-on when the potential between its control and first electrodes exceeds a minimum turn-on value and is of a polarity to turn on the transistor;
    a first and a second one of said plurality of transistors being differentially connected with their first electrodes being connected in common to a first node to which is connected a first relatively constant current source for producing a first current having an amplitude IA;
    means for applying a differential input voltage between the control electrodes of said first and second transistors;
    first and second current mirror amplifiers (CMAs), each CMA having an input terminal and an output terminal; each CMA producing an output current at its output terminal which is proportional to the input current at its input terminal;
    means connecting the input terminal of the first CMA and the outpost terminal of the second CMA to the second electrode of the first transistor;
    means connecting the output terminal of the first CMA to the second electrode of the second transistor;
    a second current source for producing a second current IB;
    means coupling the second current source to the input terminal of the second CMA and including means responsive to a difference in the current flowing between the output of the first CMA and the second electrode of the second transistor, for enabling the current IB of the second current source to flow in the input terminal of the second CMA and for causing a current proportional to IB to flow between the output terminal of the second CMA and the second electrode of the first transistor.

2. The combination as claimed in claim 1, wherein the amplitude of the second current IB is proportional to the amplitude of the first current.

3. The combination as claimed in claim 1, wherein the means responsive to a difference in the current flowing includes a transistor having its control electrode connected to the second electrode of the second transistor and having its conduction path connected between the input terminal of the second CMA and the second current source.

4. The combination as claimed in claim 1, wherein the first CMA includes third and fourth transistors and the second CMA includes fifth and sixth transistors;
    wherein the control electrodes of the third and fourth transistors and the second electrode of the third transistor are connected to the second electrode of the first transistor and the second electrode of the fourth transistor is connected to the second electrode of the second transistor; and
    wherein the second electrode of the fifth transistor is connected to the input terminal of the second CMA and to the second current source and the second electrode of the sixth transistor is connected to the second electrode of the first transistor;
    wherein the control electrodes of the fifth and sixth transistors are coupled to the second electrode of the second transistor; and
    means connecting the first electrode of the third, fourth, fifth and sixth transistors to a common circuit point.

5. The combination as claimed in claim 1, wherein the first CMA includes third and fourth transistors and the second CMA includes fifth and sixth transistors;
    wherein the control electrodes of the third and fourth transistors and the second electrode of the third transistor are connected to the second electrode of the first transistor and the second electrode of the fourth transistor is connected to the second electrode of the second transistor; and
    wherein the second electrode of the fifth transistor is connected to the input terminal of the second CMA and to the second current source and the second electrode of the sixth transistor is connected to the second electrode of the first transistor;
    wherein the control electrodes of the fifth and sixth transistors are connected to the second electrode of the fifth transistor and means connecting the second electrode of the fifth transistor to the input terminal of the second CMA; and
    means connecting the first electrode of the third, fourth, fifth and sixth transistors to a common circuit point.

6. The combination as claimed in claim 4, wherein the first and second transistors are bipolar transistors of NPN conductivity type; wherein the third, fourth, fifth and sixth transistors are bipolar transistors of PNP conductivity type; and wherein the first electrodes of the third, fourth, fifth and sixth transistors are connected to a power terminal adapted to receive a fixed operating potential.

7. The combination as claimed in claim 1, wherein the first relatively constant current source includes a third transistor and the second current source includes a fourth transistor; the third and fourth transistors being of the same conductivity type as the first and second transistors;

wherein the first electrodes of the third and fourth transistors are connected to a first point of operating potential;

wherein a fixed bias signal is applied to the control electrodes of the third and fourth transistors;

wherein the second electrode of the third transistor is connected to the first node for producing said first current of amplitude IA; and wherein the second electrode of the fourth transistor is coupled to the input terminal of the second CMA for producing said current IB and enabling the current IB in the fourth transistor to flow in the second CMA.

8. The combination as claimed in claim 7, wherein the input of the second CMA is coupled to a circuit output terminal;

wherein the second current source is coupled to the circuit output terminal; and wherein said means responsive to a difference in the current flow between the output of the first CMA and the second electrode of the second transistor controls the flow of current between the input terminal of the second CMA and the second current source.

9. The combination as claimed in claim 8, wherein the first, second, third and fourth transistors are bipolar transistors of NPN conductivity type.

10. The combination comprising:

first and second transistors of the same conductivity type, each transistor having first and second electrodes defining the ends of a main conduction path and a control electrode, each transistor being turned-on when the potential between its control and first electrodes exceeds a minimum turn-on value and is of a polarity to turn on the transistor; said first and second transistors being differentially connected with their first electrodes being connected in common to a first node to which is connected a first relatively constant current source for producing a current having an amplitude IA;

means for applying a differential input signal between the control electrodes of said first and second transistors;

first and second current mirror amplifiers (CMAs), each CMA having an input terminal and an output terminal; each CMA producing an output current at its output terminal which is proportional to the input current at its input terminal;

means connecting the input terminal of the first CMA and the output terminal of the second CMA to the second electrode of the first transistor;

means connecting the output terminal of the first CMA to the second electrode of the second transistor;

a second current source for producing a current IB;

means coupled between the second current source and the input terminal of the second CMA and including means coupled to the second electrode of the second transistor for sensing the amplitude and sense of the current flowing between the output of the first CMA and the second electrode of the second transistor for:

a—in response to a difference in one sense in the current flowing between the output of the first CMA and the second electrode of the second transistor enabling the current IB to flow in the input of the second CMA and thereby causing a current proportional to IB to flow between the output of the second CMA and the second electrode of the first transistor; and b—in response to a difference in the opposite sense disabling the current IB from flowing in the input of the second CMA.

11. The combination comprising:

a differential amplifier stage having first and second differential input terminals for the application therebetween of an input voltage VIN, first and second differential output terminals, and a common node;

a first relatively constant current source coupled between the common node and a first power terminal;

first and second current mirror amplifiers (CMAs), each CMA having an input terminal and an output terminal; each CMA producing an output current at its output terminal which is proportional to the input current at its input terminal;

means coupling the input terminal of the first CMA and the output terminal of the second CMA to the first differential output terminal;

means coupling the output terminal of the first CMA to the second differential output terminal;

a circuit output terminal;

means coupling the input terminal of the second CMA to the circuit output terminal;

a second current source coupled between the first power terminal and the circuit output terminal; and means coupled between one of said differential output terminals and the second CMA for selectively enabling the current in the second current source to flow in the input terminal of the second CMA.

12. The combination comprising:

a differential amplifier stage, operated at a first relatively constant current level provided by a first current source and having first and second differential input terminals and first and second differential output terminals;

first and second current mirror amplifiers (CMAs), each CMA having an input terminal and an output terminal; each CMA producing an output current at its output terminal which is proportional to the input current at its input terminal;

means connecting the input terminal of said first CMA and the output terminal of said second CMA to the first differential output terminal;

means connecting the output terminal of said first CMA to the second differential output terminal;

a second relatively constant current source providing a current which is a fixed ratio of the current produced by said first current source;

means coupled between the second relatively constant current source and the input terminal of the second CMA, said coupling means being coupled to the second differential output and being responsive to the amplitude and sense of the current at said second differential output terminal for selectively coupling the second current source to the input terminal of the second CMA for producing a proportional current at the output terminal of the second CMA.

13. The combination as claimed in claim 12, wherein said second CMA includes first and second CMA transistors, each transistor having first and second electrodes defining the ends of a main conduction path and a control electrode;

wherein said first CMA transistor is connected at its second electrode to said second CMA output terminal;

wherein the control electrodes of said first and second CMA transistors and the second electrode of said second CMA transistor are connected to said second CMA input terminal; and wherein the first electrodes of the first and second CMA transistors are connected to a point of fixed operating potential.

14. The combination as claimed in claim 13, wherein said means coupling the second relatively constant current source to the input terminal of the second CMA includes an insulated-gate-field-effect-transistor (IGFET) having a conduction path connected between the input terminal of the second CMA and the second current source and having a control electrode connected to the second differential output terminal.

15. The combination as claimed in claim 14, including a still further additional transistor having a conduction path and a control electrode; said still further additional transistor having its control electrode connected to said second current source and its conduction path connected between a point of operating potential and the second differential output terminal.

16. The combination as claimed in claim 1, wherein said second CMA includes first and second CMA transistors; wherein the second electrode of said first CMA transistor is connected to said output terminal of said second CMA and to the second electrode of said first transistor; wherein the second electrode of said second CMA transistor is connected to said input terminal of said second CMA and coupled to said second current source; wherein the control electrodes of said first and second CMA transistors are connected to a common point; and wherein the first electrodes of said first and second CMA transistors are connected to a point of fixed operating potential.

17. The combination as claimed in claim 16, wherein there is also included a third CMA transistor operated in the follower mode having its control electrode connected to the second electrode of the second CMA transistor, its second electrode connected to said point of fixed operating potential and its first electrode connected to said second electrode of said second transistor.

18. The combination as claimed in claim 16, including means coupled between the second electrode of said second transistor and the control electrodes of said first and second CMA transistors for providing a conduction path therebetween.

* * * * *